(12) United States Patent
Fantini et al.

(10) Patent No.: US 12,412,626 B2
(45) Date of Patent: Sep. 9, 2025

(54) ACCESSING MEMORY CELLS IN A VERTICAL MEMORY ARRAY

(71) Applicant: Micron Technology, Inc., Boise, ID (US)

(72) Inventors: Paolo Fantini, Vimercate (IT); Corrado Villa, Sovico (IT); Stefan Frederik Schippers, Peschiera del Garda (IT); Lorenzo Fratin, Buccinasco (IT)

(73) Assignee: Micron Technology, Inc., Boise, ID (US)

( * ) Notice: Subject to any disclaimer, the term of this patent is extended or adjusted under 35 U.S.C. 154(b) by 742 days.

(21) Appl. No.: 17/597,816

(22) PCT Filed: Dec. 9, 2020

(86) PCT No.: PCT/IB2020/020078
§ 371 (c)(1),
(2) Date: Jan. 25, 2022

(87) PCT Pub. No.: WO2022/123284
PCT Pub. Date: Jun. 16, 2022

(65) Prior Publication Data
US 2022/0366983 A1    Nov. 17, 2022

(51) Int. Cl.
*G11C 16/04*    (2006.01)
*G11C 13/00*    (2006.01)
(Continued)

(52) U.S. Cl.
CPC ...... *G11C 16/0433* (2013.01); *G11C 13/0004* (2013.01); *G11C 13/0026* (2013.01);
(Continued)

(58) Field of Classification Search
CPC ... G11C 16/0433; G11C 16/08; G11C 16/102; G11C 16/24; G11C 13/0004; G11C 13/0026; G11C 13/0028; G11C 2013/0088
(Continued)

(56) References Cited

U.S. PATENT DOCUMENTS 8,351,236 B2 *  1/2013  Yan ................. B82Y 10/00
                                              365/174
10,374,014 B2 *  8/2019  Nardi ................. H10N 70/8828
(Continued)

FOREIGN PATENT DOCUMENTS

TW          202040790 A    11/2020

OTHER PUBLICATIONS

Taiwanese Patent Office, "Office Action", issued in connection with Taiwanese Patent Application No. 110144328 dated Jun. 21, 2022 (13 pages).
(Continued)

*Primary Examiner* — Connie C Yoha
(74) *Attorney, Agent, or Firm* — Holland & Hart LLP

(57) ABSTRACT

The present disclosure provides a memory apparatus and a method for accessing a 3D vertical memory array. The 3D vertical memory array comprises word lines organized in planes separated from each other by insulating material, bit lines perpendicular to the word line planes, memory cells coupled between a respective word line and a respective bit line. The apparatus also comprises a controller configured to select multiple word lines, select multiple bit lines, and simultaneously access multiple memory cells, with each memory cell at a crossing of a selected word line and a selected bit line. The method comprises selecting a multiple word lines, selecting multiple bit lines and simultaneously accessing multiple memory cells, with each memory cell at
(Continued)

a crossing of a selected word line of the selected multiple word lines and a selected bit line of the selected multiple bit lines. A method of manufacturing a 3D vertical memory array is also described.

29 Claims, 6 Drawing Sheets

(51) Int. Cl.
  *G11C 16/08* (2006.01)
  *G11C 16/10* (2006.01)
  *G11C 16/24* (2006.01)
(52) U.S. Cl.
  CPC .......... *G11C 13/0028* (2013.01); *G11C 16/08* (2013.01); *G11C 16/102* (2013.01); *G11C 16/24* (2013.01); *G11C 2013/0088* (2013.01)
(58) Field of Classification Search
  USPC ....................................................... 365/180
  See application file for complete search history.

(56) References Cited

U.S. PATENT DOCUMENTS

| | | | |
|---|---|---|---|
| 11,817,449 B2* | 11/2023 | Ting .................... | H10D 89/921 |
| 2008/0258129 A1 | 10/2008 | Toda | |
| 2015/0325292 A1 | 11/2015 | Scheuerlein | |
| 2016/0204117 A1* | 7/2016 | Liu ........................ | H10B 41/35 |
| | | | 257/324 |
| 2017/0256310 A1* | 9/2017 | Arayashiki ......... | G11C 13/0011 |
| 2019/0027224 A1* | 1/2019 | Choo .................... | G11C 16/30 |
| 2019/0067376 A1 | 2/2019 | Murooka | |
| 2019/0115391 A1 | 4/2019 | Nardi et al. | |
| 2020/0258940 A1 | 8/2020 | Vereen et al. | |
| 2020/0350203 A1 | 11/2020 | Fratin et al. | |

OTHER PUBLICATIONS

ISA/IB, "International Search Report and Written Opinion of the International Searching Authority," issued in connection with Int'l Appl. No. PCT/IB2020/020078, dated Sep. 9, 2021 (12 pages).

* cited by examiner

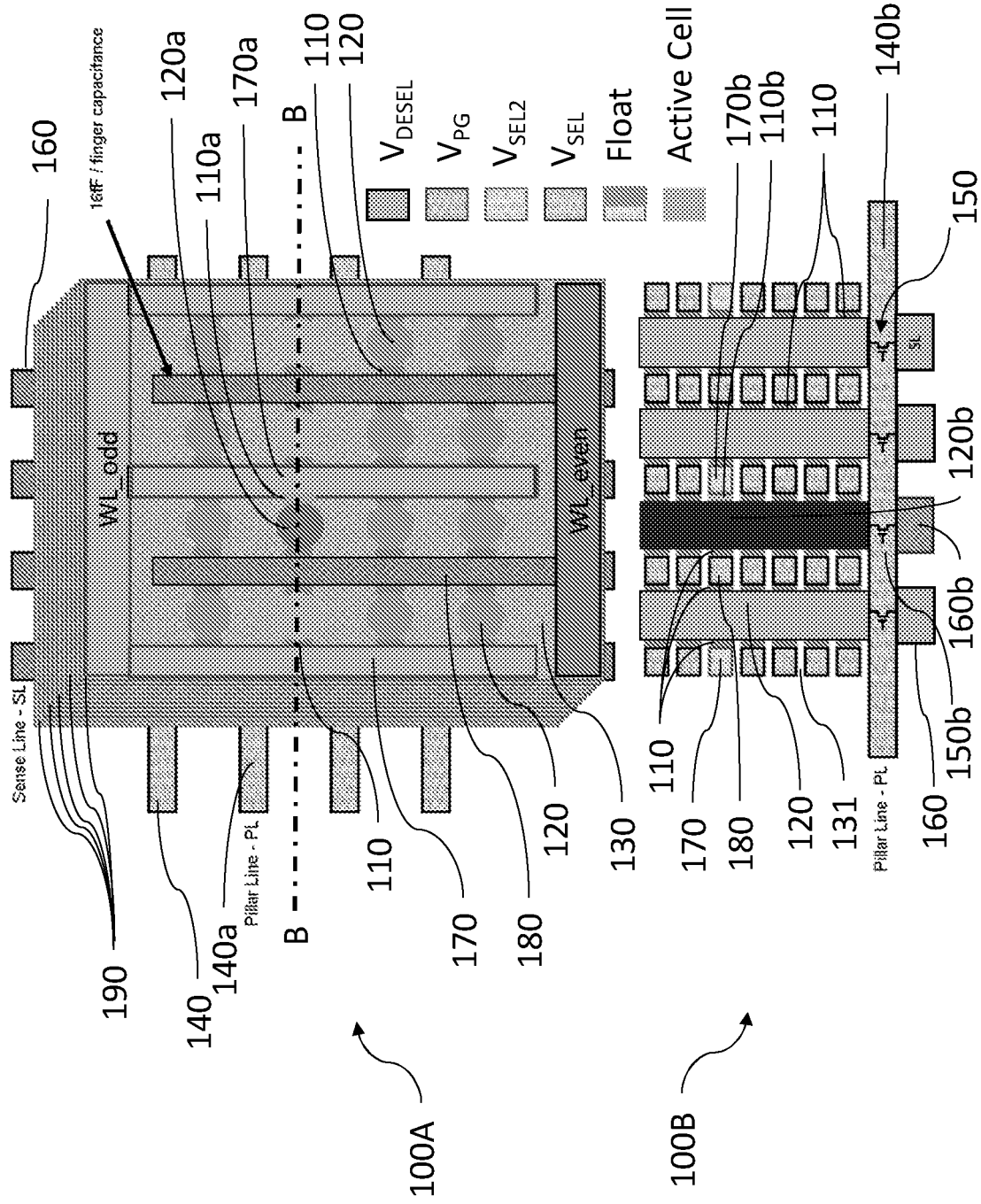

ACCESSING MEMORY CELLS IN A VERTICAL MEMORY ARRAY

CROSS REFERENCE

The present Application for Patent is a 371 national phase filing of International Patent Application No. PCT/IB/2020/020078 by FANTINI et al., entitled "MEMORY APPARATUS AND METHODS FOR ACCESSING AND MANUFACTURING THE SAME," filed Dec. 9, 2020, which is assigned to the assignee hereof, and which is expressly incorporated by reference herein.

TECHNICAL FIELD

The present disclosure relates to a field of electronics, and more specifically to a memory apparatus that supports read/write parallelism and a method for accessing the same.

BACKGROUND ART

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0". In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Memory resources have innumerable applications in electronic devices and other computing environments. Continued drive to smaller and more energy efficient devices has resulted in scaling issues with traditional memory devices. Thus, there is a current demand for memory devices that can potentially scale smaller and have better performances than traditional memory devices. One of the most difficult problems to solve regards read/write throughput, that is normally limited by parallelism in access operations.

In conventional chalcogenide-based memory cell arrays, parallel access to memory cells within a same physical array (e.g., a memory tile) is strongly limited by the architecture. First of all, it is not possible to simultaneously address memory cells on different word line (WL)/bit line (BL) pairs without affecting other unaddressed memory cells. For example, if addressed memory cells are at crossing of $WL_J/BL_K$ and $WL_M/BL_N$, where $WL_X$ and $BL_Y$ respectively represent the word line X and the bit line Y in the memory array), not addressed cells at crossing of addressed word lines/bit lines would also be biased (e.g., $WL_J/BL_N$ and $WL_M/BL_K$) because the respective access lines are shared with addressed cells.

Moreover, it is normally impossible to effectively address memory a pair or more cells on same WL (or BL), because of current-related limitations. As a matter of fact, as soon as one memory cell snaps or thresholds, the current driven produces a voltage drop associated to the access line resistance, therefore inhibiting possible snapping of a second cell sharing the same access line. To say it differently, the ohmic voltage drop on access lines, e.g., WL (or BL), depends on the physical location of and the total current driven by the addressed memory cells that normally may be a function of the datum stored therein; such a position and datum dependency cannot be managed and may lead to misfunctioning, In the present disclosure, a 3D vertical memory array is disclosed that is suitable for parallel access. The present disclosure further relates to improvements of memory access methods; for example, a read/write parallelism of memory cells, in order to increase the throughput and improve performances. A method of manufacturing a 3D vertical memory array is also described.

BRIEF DESCRIPTION OF THE DRAWINGS

FIG. 1A is a schematic top view of an example of a 3D memory array that supports the read/write parallelism in accordance with embodiments of the present disclosure.

FIG. 1B is a schematic cross-sectional view of the 3D memory array that supports the read/write parallelism shown in FIG. 1A in accordance with embodiments of the present disclosure.

DETAILED DESCRIPTION

Figure 1:
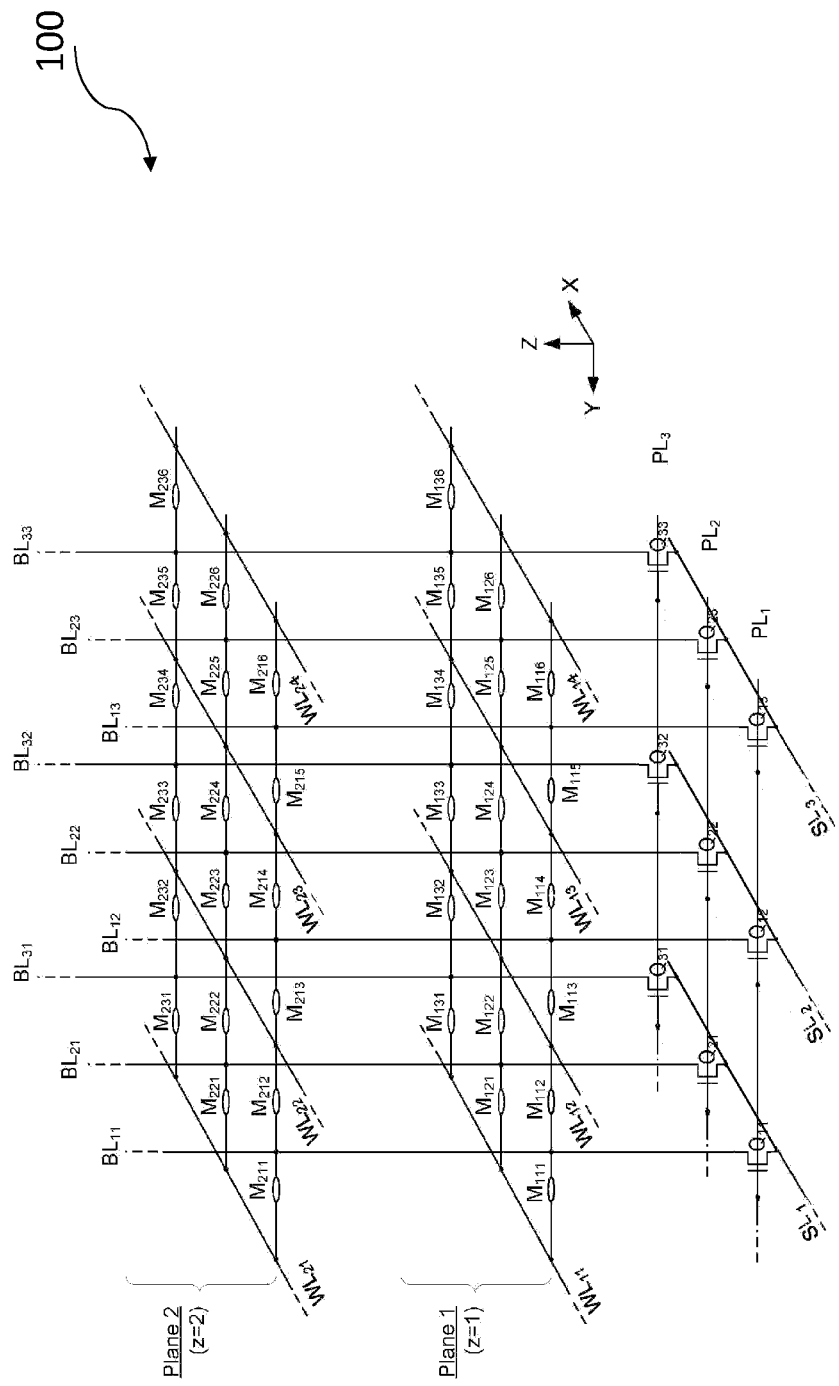
FIG. 1 is a diagram of an example 3D vertical memory array that supports the read/write parallelism in accordance with an embodiment of the present disclosure.

The present disclosure relates to three-dimensional (3D) vertical self-selecting memory arrays with an increased density of memory cells and a reduced power consumption, and methods of manufacturing the same.

A 3D vertical memory array may comprise word lines organized in planes separated from each other by insulating material. The memory array may also comprise bit lines perpendicular to the word line planes. Memory cells may be coupled between a respective word line and a respective bit line. A controller may be configured to select multiple word lines, select multiple bit lines, and simultaneously access multiple memory cells with each memory cell at a crossing of a selected word line and a selected bit line.

Each bit line in a row of bit lines may be coupled to a respective selection transistor, for example Thin Film Transistors (TFT), in a row of selection transistors that have a common gate and respective first nodes coupled to sense lines. The row of selection transistors may be enabled applying a pass gate voltage to the common gate. To select a bit line, a bit line selection voltage may be applied to first nodes of corresponding selection transistor in the row. Multiple bit lines may be selected simultaneously. A bit line deselection voltage may be applied to first nodes of corresponding second selection transistors in the row. Bit line drivers may selectively drive the selected or deselected bit lines; each bit line driver may be configured to drive a single cell coupled to a corresponding selected bit line.

Each word line may be selected applying a word line selection voltage, that may have an opposite polarity with respect to a polarity of the bit line selection voltage. Multiple word lines may be selected simultaneously and multiple memory cells may be simultaneously accessed, each memory cell at a crossing of a selected word line and a selected bit line.

Pairs of word line plates with interdigited word line fingers may be provided on each word line plane. A spine portion of the word line plate may collect a total current of the simultaneously accessed multiple memory cells coupled to the selected multiple word lines fingers. The spine portion may have a width that is larger than a width of any word line finger. A word line plate driver may drive a word line plate (and therefore all word line fingers coupled thereto and respective memory cells accessed in parallel) to the desired word line selection voltage, or to a word line deselection voltage.

Bit lines on different rows may be deselected applying an inhibit voltage to the corresponding plurality of common gates of respective rows of third selection transistors different from the row of selection transistors. Word lines on different planes may be deselected applying a word line deselection voltage or a floating voltage. Bit line and/or word line deselection voltages may be intermediate voltages between the bit line and the word line selection voltages. In some cases, the selection voltages may have an opposite polarity and a same or about same amplitude. In some cases, the deselection voltages may be a ground or virtual ground voltage.

The memory arrays may include an arrangement of conductive contacts and openings through alternative layers of conductive materials and insulative material that may decrease the spacing between the memory cells while maintaining a dielectric thickness to sustain the voltage to be applied to the memory array.

In some examples, a 3D memory array may include a substrate with a plurality of contacts arranged in a pattern (e.g., a geometric pattern) and a first insulative material (e.g., a dielectric material) formed on the substrate. A plurality of planes of a conductive material may be separated from one another by a second insulative material (e.g., a dielectric material) and formed on the substrate material. The planes of conductive material may be examples of word lines.

A method of manufacturing a 3D vertical memory array may comprise forming a plurality of word line planes, the word line planes separated from each other by insulating material formed therebetween.

During manufacturing of such a memory array, a trench may be formed in a shape that separates odd and even WL line planes to create "comb" structures (e.g., structures with fingers and space between the fingers). The trench may have any geometric configuration and include odd and even groups of fingers of the comb facing one another at a fixed distance. In some examples, the trench may be formed in a serpentine shape. The trench may divide each plane of conductive material into two sections or two plates. The two sections or plates may be interleaved with interdigited fingers, e.g., each finger associated to one section or plate is substantially facing a pair of fingers associated to the other section or plate, being separated by each of them by a dielectric material therebetween, as it will be described below. Fingers of either section or plate may have a same or similar width.

A method of manufacturing a 3D vertical memory array may comprise forming a plurality of word line fingers on a plurality of word line planes, the word line planes separated from each other by insulating material. In some embodiments, a method of manufacturing a 3D vertical memory array may comprise forming a plurality of word line fingers comprises forming pairs of word line plates with interdigited word line fingers on each word line plane.

Each plate of conductive material may be an example of a word line plate. In some examples, inside the trench, the planes of the conductive material may be etched in such a way that the dielectric materials and the conductive materials form a plurality of recesses, where each recess may be configured to receive a storage element material (e.g., a chalcogenide material). A sacrificial layer (e.g., a conformal material) may be deposited in the trench and, in some cases, the sacrificial layer fills the recesses. An insulative material may be deposited in the trench on top of the sacrificial layer.

The sacrificial layer and the insulative layer may form a serpentine shape. In some examples, other geometric configurations of the trench are contemplated. In some examples, at least one particular separation trench may be formed to be filled with an insulation material (e.g., a dielectric material), so that the memory array is divided into several portions, each of which includes a certain number of digit lines which will be formed later, and word lines at one side of the separation trench are electrically separated from word lines at the other side of the separation trench. Word lines at one side of the separation trench may be associated to a first word line plate, or comb, and word lines at the other side of the separation trench may be associated to a second word line plate, or comb; the two word line plates or combs may be interleaved with interdigited fingers, wherein each finger may be a word line of respective word line plate. Word lines associated to either word line plate may have a same or similar width.

First and second word line plates, or combs, in any given conductive plane, have respective spine portions coupled to the respective fingers or word lines. A spine portion may be a conductive rail coupled between each and all the word lines of the word line plate and a contact region, for example an area in the spine portion, coupled to word line driving circuitry. In some cases, the contact region may be formed as part of a staircase contact region to the different conductive planes. For example, contact regions of vertically adjacent conductive planes (e.g., word line plates and corresponding spine portions) may be formed by an etch and recess sequence and be horizontally adjacent to each other (in the recess direction of the etch and recess process). The spine portion of each word line plate may be formed, for example during a masked etch step (that may be the same step used to form the serpentine-shaped trench, or a different step), to be wider than fingers or word lines. For example, the spine portion may have a width that is from twice to many times the width of a word line. In some cases, the spine width may be 16 times the width of a word line finger; in other cases, it may exceed the width of a word line by a factor 4, 10. 50, 64, or even more.

A method of manufacturing a 3D vertical memory array may comprise forming a spine portion coupled to a subset of the plurality of word line fingers on a word line plane, the spine portion having a width greater than a width of each of the word line fingers in the subset of plurality of word line fingers Portions of the sacrificial layer and the insulative may be removed to form openings. The openings may expose portions of the substrate, the plurality of conductive contacts, and portions of the conductive materials and dielectric materials. A storage element material (e.g., the chalcogenide material) may be deposited in the openings. The storage element material may fill the recesses formed by the dielectric materials and the conductive materials. The storage element material may be partially removed from the openings such that only the storage element materials in the recesses remain.

A method of manufacturing a 3D vertical memory array may comprise forming memory cells at a crossing of word lines fingers and bit line pillars, the bit line pillars formed as explained in more detail below. In some embodiments of a manufacturing method of a 3D vertical memory array, forming memory cells at a crossing of word line fingers and bit line pillars comprises forming a chalcogenide material between a word line finger material and a bit line pillar material.

Conductive pillars may be formed in the openings that include the storage element materials in the recesses. The conductive pillars may be examples of digit lines. The conductive pillars may be arranged to extend (e.g., substantially perpendicular) to the planes of the conductive material and the substrate. Each conductive pillar may be coupled with a different conductive contact. The pillars may be formed of a barrier material and a conductive material. Conductive pillars and/or digit lines may have a same or similar dimension.

A method of manufacturing a 3D vertical memory array may comprise forming a plurality of bit line pillars perpendicular to the plurality of word line planes.

Such configurations of a memory array and the methods of manufacturing may allow a higher-density of memory cells and a reduced power consumption relative to previous solutions. Each memory cell (e.g., storage element material) may be recessed inside opposite sides of the conductive pillar to ensure the cell isolation. Such a configuration may allow for a tighter control of cell thickness and dimension with respect to some previous solutions. Each plane of conductive material that intersects the conductive pillar may form two memory cells addressed by a first word line plate in the plane and a second word line plate in the plane. Each conductive pillar may be decoded by a transistor positioned at the bottom or top of the memory array. The transistor may be an example of a digit line selector formed in a regular matrix.

Multiple memory cells may be simultaneously accessed, each memory cell at a crossing of a selected word line of the selected multiple word lines and a selected bit line of the selected multiple bit lines. Multiple word lines and multiple bit lines in the memory array are selected and biased by respective bit line and word line drivers. A plurality of bit line drivers may be provided, each bit line driver selectively coupled to respective bit line pillar; in some cases, the bit line drivers are formed using CMOS under Array (CuA) technology. A plurality of word line drivers may also be provided, each word line driver coupled to a word line plate inclusive of the plurality of word line fingers in respective word line plane; in some cases, the bit line drivers are formed using CMOS under Array (CuA) technology. Each bit line driver may be configured to drive a single memory cell and/or each word line driver may be configured to drive multiple simultaneously accessed memory cells.

A method of manufacturing a 3D vertical memory array may further comprise forming bit line drivers each bit line driver selectively coupled to respective bit line pillar and configured to drive a single memory cell and forming word line drivers each word line driver coupled to a word line plate inclusive of the plurality of word line fingers in respective word line plane, each word line driver configured to drive multiple memory cells simultaneously accessed.

Figure 4:
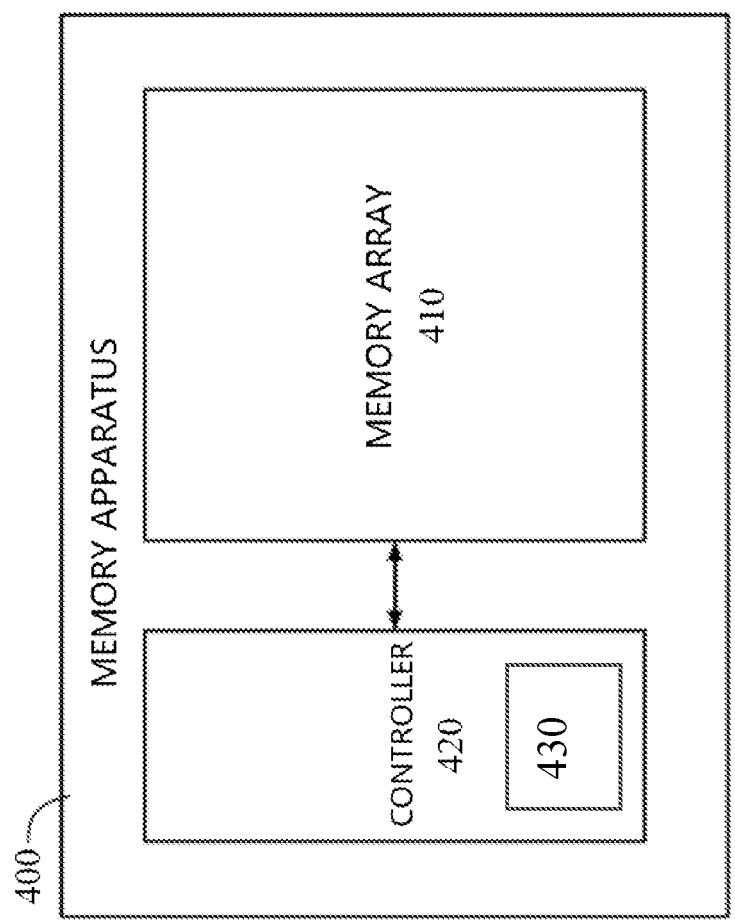
FIG. 4 is a block diagram of a memory apparatus that supports the read/write parallelism in accordance with an embodiment of the present disclosure.
Figure 5:
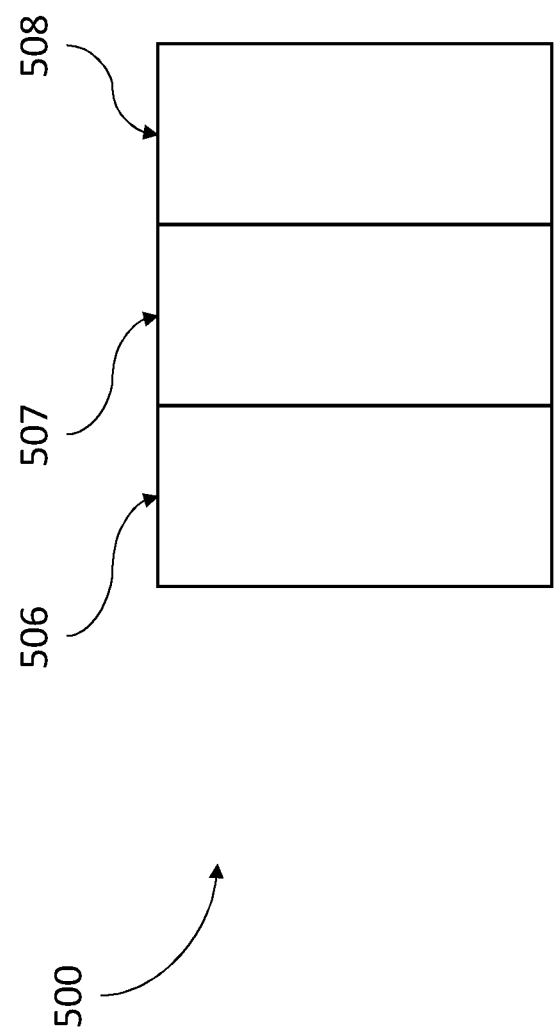
FIG. 5 is a simplified memory cell possibly used in a 3D vertical memory array that supports the read/write parallelism in accordance with an embodiment of the present disclosure.

Features of the disclosure are initially described with reference to memory cells as depicted in FIG. 5 in the context of a memory array as schematically described with reference to FIG. 1. Other aspects of the disclosure are described with reference to top and section views of a 3D vertical memory array as depicted in FIGS. 1A, 1B and 2. A method according to the disclosure is described with reference to FIG. 3. Finally, other aspects are illustrated with reference to the apparatus of FIG. 4.

FIG. 5 depicts a simplified structure of a memory cell 500 possibly used in a 3D vertical memory array that supports the read/write parallelism in accordance with an embodiment of the present disclosure. Memory cell 500 may comprise a two-terminal memory cell. In some embodiments, memory cell 500 may be a resistive memory cell. In some embodiments, memory cell 500 may be a variable resistance memory cell. In some cases, memory cell 500 may be a chalcogenide-based memory cell; this example will be used in the description here below, without any limitation to the type of memory cell.

Memory cell 500 may comprise a first terminal 508, a second terminal 506 and an element 507, e.g., a memory element (in some cases a chalcogenide material element), coupled between the first terminal and the second terminal.

First terminal 508 in FIG. 5 is representative of a generic terminal of memory cell 500. Terminal 508 may comprise a first cell electrode 508 that may be coupled to an access line, such as a bit line, for example. First electrode 508 may comprise a carbon-containing electrode, in some embodiments; other electrode materials are suitable to form first terminal 508. For the discussion that follows (e.g., with reference to voltages applied to memory cell 500), first terminal 508 may correspond to an access line, such as a bit line or a bit line pillar, in some examples. Said it differently, first terminal 508 may comprise a bit line pillar material or at least be coupled thereto.

Second terminal 506 in FIG. 5 is representative of another generic terminal of memory cell 500. Terminal 506 may comprise a second cell electrode 506 that may be coupled to an access line, such as a word line, for example. Second electrode 506 may comprise a carbon-containing electrode, in some embodiments; other electrode materials are suitable to form second terminal 506. For the discussion that follows (e.g., with reference to voltages applied to memory cell 500), second terminal 506 may correspond to an access line, such as a word line or a word line finger, in some examples. Said it differently, second terminal 506 may comprise a word line finger material or at least be coupled thereto.

Other materials and/or layers (not shown) may be present between each of first 506 and second 508 terminals and element 507. For example, adhesion materials, barrier material, or other conductive or insulating materials may be formed.

Memory's element 507 may comprise a chalcogenide material, in some embodiments. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—SbGe, Te—Ge—Sb—S, Te—Ge—Sn—O, Te—Ge—Sn—Au, Pd—Te—Ge—Sn, In—Se—Ti—Co, Ge—SbTe—Pd, Ge—Sb—Te—Co, Sb—Te—Bi—Se, Ag—In—Sb—Te, Ge—Sb—Se—Te, Ge—Sn—Sb—Te, GeTe—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer.

A chalcogenide material may have storage, e.g., memory, properties and selection properties, as discussed below. Element 507 may be coupled between a word line finger (possibly coupled to a respective word line plate, as it will be discussed with reference to subsequent figures) and one bit line pillar. Chalcogenide material may simultaneously behave as a selection element and as a storage element. For example, chalcogenide material in element 507 may sink no or negligible current when biased at a small voltage and it may sink a significant amount of current when biased at a higher voltage (e.g., a voltage exceeding a threshold voltage of chalcogenide material). With respect to this aspect, memory cells 500 biased at a relatively low voltage may be deselected while memory cells biased at a relatively high voltage may be selected. Accordingly, chalcogenide material may have selection properties.

Additionally, chalcogenide material in element 507 may exhibit a threshold voltage variation based on a polarity (and amplitude) of a programming pulse previously applied. For example, based on a programming pulse of a first polarity (let's say a positive polarity, where positive polarity may be defined as a polarity in which a voltage of the first terminal 508 is higher than a voltage of the second terminal 506, but the opposite convention may be adopted) being applied to memory cell 500, if the programming pulse has a magnitude exceeding the memory cell's threshold, the memory cell threshold will be moved to a relatively low value in the first polarity (e.g., a positive threshold voltage lower than a positive reference demarcation voltage $V_{DM}$). On the contrary, based on a programming pulse of a second polarity opposite to the first polarity (e.g., a negative polarity, in the example above) being applied to memory cell 500, if the programming pulse has a magnitude exceeding the memory cell's threshold, the memory cell threshold will be moved to a relatively high value in the first polarity (e.g., a positive threshold voltage higher than the positive reference demarcation voltage $V_{DM}$).

In a similar but symmetric fashion, based on a programming pulse of the first polarity (a positive polarity) being applied to memory cell 500, if the programming pulse has a magnitude exceeding the memory cell's threshold, the memory cell threshold will be moved to a relatively high absolute value in the second polarity (e.g., a negative threshold voltage lower than a negative reference demarcation voltage $V_{DM2}$—in some cases, but not necessarily, $V_{DM2}$ may be opposite to $V_{DM}$, e.g., $V_{DM2}=-V_{DM}$) and, based on a programming pulse of the second polarity (e.g., a negative polarity) being applied to memory cell 500, if the programming pulse has a magnitude exceeding the memory cell's threshold, the memory cell threshold will be moved to a relatively low absolute value in the second polarity (e.g., a negative threshold voltage higher than the negative reference demarcation voltage $V_{DM2}$).

Accordingly, based on a polarity of a programming pulse last applied, memory cell 500 may be programmed in one of two states. For example, a memory cell may be SET with a positive polarity pulse and it may be RESET with a negative polarity pulse. Not discussed variations to the programming algorithm as described above in a simplified way may allow to program the memory cell in more than two states, reaching an increased bit capacity for each physical cell. A logic value may be assigned to one of the SET and RESET state and a different logic value may be assigned to the other of the SET and RESET state (e.g., a logic 1 may correspond to the SET state and a logic 0 may correspond to the RESET state—different conventions may be adopted).

As described above, chalcogenide-based memory cells may be an example of self-selecting memory cells, e.g., chalcogenide material in element 507 may behave both as a selection element and a memory element. In other embodiments, separate elements (e.g., a memory element comprising a memory storage material and a selection element comprising a selection material—not shown) may be present in place of the sole chalcogenide material in element 507, possibly separated by an electrode therebetween.

Self-selecting memory cells may be formed at a crossing of word line fingers and bit line pillars in the array architecture that is described with reference to the following drawings. Different kind of memory cells may, however, be formed in the described array architecture without departing from the scope of the disclosure. It should be noted than in the description above and in the description below, e.g., with reference to FIGS. 1-4, any reference to bit lines and/or word lines should be intended as generally referring to an access line (e.g., indifferently a word line or a bit line). For example, a bit line may be a first access line and a word line may be a second access line. As another example, language to a bit line pillar may also refer to a word line pillar while language to a word line finger may also refer to a bit line finger.

Figure 2:
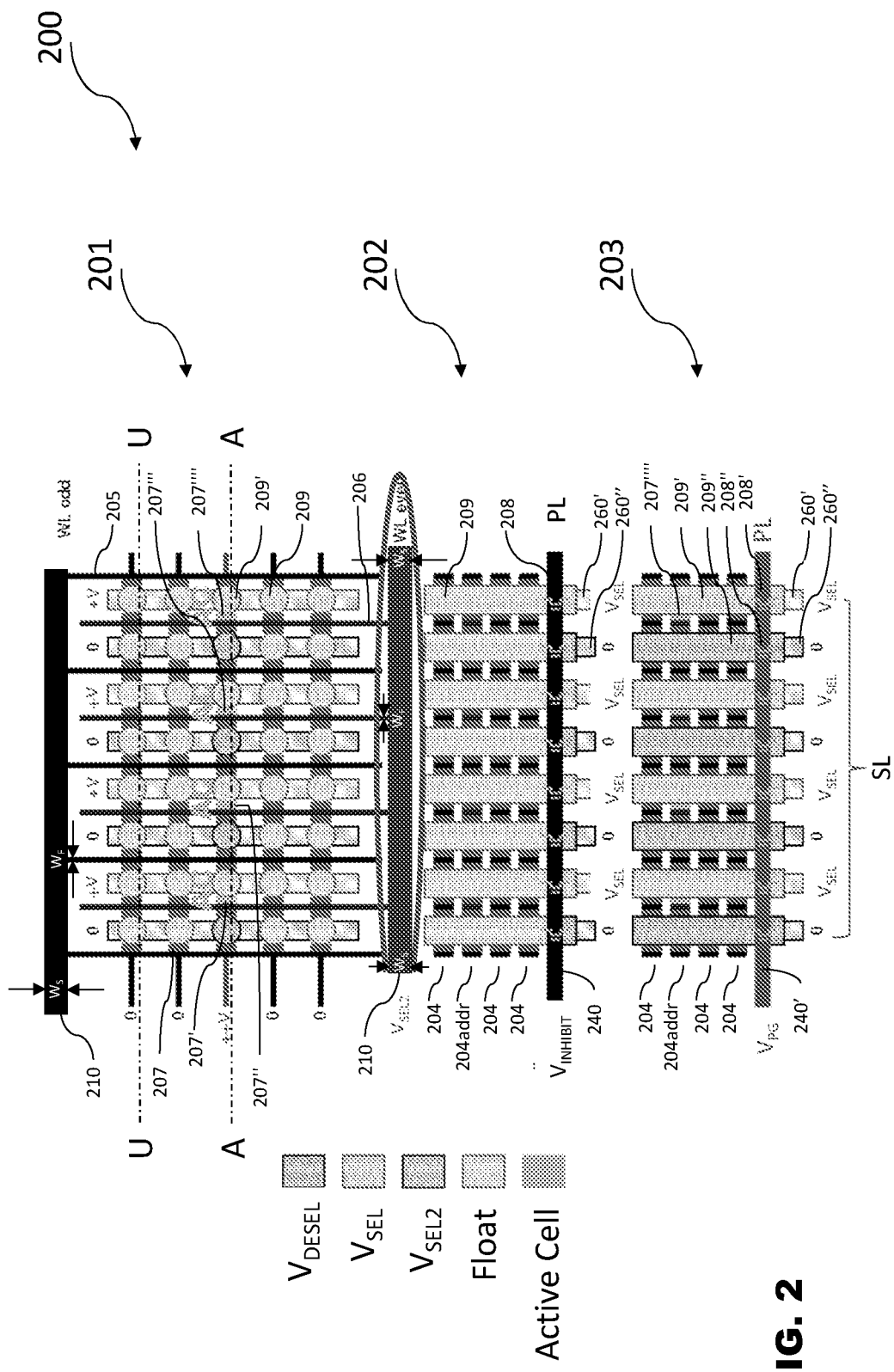
FIG. 2 shows diagrams of example 3D vertical memory array that supports the read/write parallelism in accordance with an embodiment of the present disclosure.

In FIG. 1, an architecture of a three-dimensional (3D) vertical memory array 100 that supports read/write parallelism is described using a schematic of an equivalent circuit of a portion of the 3D memory array. A standard three-dimensional rectangular coordinate system is used for reference, the directions of each of vectors x, y and z being orthogonal with the other two. In another embodiment direction x and y are substantially 60 degrees from each other. The array in FIG. 1 includes vertical pillars (bit lines).

A circuit for selectively connecting internal memory elements with external data circuits is formed using select devices ($Q_{xy}$), where x gives a relative position of the device in the x-direction, and y gives its relative position in the y-direction. The individual select devices ($Q_{xy}$) are thin film transistors (TFTs) in accordance with embodiments. In other embodiments, individual selection devices ($Q_{xy}$) are MOS transistors (e.g., Nch MOSFETs). Pillar lines ($PL_x$) are elongated in the y-direction and have relative positions in the x-direction that are indicated by the subscript. The pillar lines ($PL_x$) are individually connectable with control terminals (common gate) of a single row of TFT select devices ($Q_{xy}$) having a common position in the x-direction.

Sense lines ($SL_y$) are elongated in the x-direction and connect with the source or drain of the TFT select devices ($Q_{xy}$) having the same position in the y-direction. The other of the source or drain of the individual select devices ($Q_{xy}$) is connected with one of the bit lines ($BL_{xy}$). In an operation mode, during reading and also typically programming only one select device connected with a specific pillar line is turned on at time. According to such an operation mode, a sole memory cell is accessed at any time and a current driven by the memory cell does not affect nor disturbs other memory cells. As it will be described more in detail below, according to this disclosure, multiple memory cells may be accessed simultaneously, each of the simultaneously accessed memory cells being operated as described herein.

The bit lines are elongated vertically, in the z-direction, and form a regular two-dimensional array in the x and y directions. The TFT select devices ($Q_{xy}$) therefore connect one row of bit lines ($BL_{xy}$) across the x-direction (having the same position in the y-direction) at a time to corresponding ones of the sense lines ($SL_y$), depending upon which of the pillar lines ($PL_x$ receives a voltage that turns on the TFT select devices to which it is connected. The remaining pillar lines receive voltages that keep their connected TFT select devices ($Q_{xy}$) off. It may be noted that since only one TFT select device ($Q_{xy}$) is used with each of the bit lines ($BL_{xy}$), the pitch of the array across the semiconductor substrate in both x and y-directions may be made very small, and thus the density of the memory storage elements large. In some embodiments (not shown) sense lines ($SL_y$) and the TFT select devices ($Q_{xy}$) may be connected with respective bit lines ($BL_{xy}$) from the top of the array 100 rather than from the bottom.

Memory cells ($M_{zxy}$) are formed in a plurality of planes positioned at different distances in the z-direction above a substrate. Two planes 1 and 2 are illustrated in FIG. 1 but there will typically be additional planes such as 4, 6, 8, 16, 32, or even more. In each word line plane at distance z, word lines ($WL_{zy}$) are elongated in the x-direction and spaced apart in the y-direction between the bit lines ($BL_{xy}$). Word lines may also be referred to as word line fingers. The word lines ($WL_{zy}$) of each plane individually cross adjacent two of the bit lines ($BL_{xy}$) on either side of the word lines. The individual memory cells ($M_{zxy}$) are connected between one bit line ($BL_{xy}$) and one word line ($WL_{zy}$) adjacent these individual crossings. An individual memory cell ($M_{zxy}$) is therefore addressable by placing proper voltages on the bit line ($BL_{xy}$) and word line ($WL_{zy}$) between which the memory cell is connected (e.g., a memory cell may be addressed by selecting a properly biasing the bit line pillar and the word line finger the memory cell is coupled between). The voltages are chosen to provide the electrical stimulus necessary to cause the state of the memory element to change from an existing state to the desired new state. During a read access phase, the voltages are chosen to provide electrical stimulus necessary to test the state of the memory element. After the device is first fabricated, voltages may be selected to provide the electrical stimulus necessary to "form" the memory cell, which refers to lowering its resistance from a virgin state. The levels, duration and other characteristics of these voltages depend upon the material that is used for the memory elements.

Each "plane" of the 3D memory structure is typically formed of at least two layers, one in which the conductive word lines ($WL_{zy}$) are positioned and another of a dielectric material that electrically isolates the conductive planes from each other. Additional layers may also be present in each plane, depending for example on the structure of the memory cells ($M_{zxy}$). The planes are stacked on top of each other above a semiconductor substrate with the bit lines ($BL_{xy}$) being connected with storage cells ($M_{zxy}$) of each plane through which the bit lines extend.

According to the read/write parallelism, a row of TFTs can be turned on by applying a first voltage (for example, a pass gate voltage $V_{PG}$) to the common gate through the pillar lines, for example, $PL_2$; in case of N-type select devices, $V_{PG}$ may be a voltage higher than the voltage $V_{SEL}$(see below) that needs to be transferred to the bit lines (for example, if voltage $V_{SEL}$ is a positive voltage, $V_{PG}$ may be a positive voltage with higher amplitude; if voltage $V_{SEL}$ is a negative voltage, $V_{PG}$ may be a ground voltage, a positive voltage or a negative voltage with smaller amplitude). Selected sense lines ($SL_y$) are biased to a bit line selection voltage $V_{SEL}$. The selection voltage may be, adopting an exact bit line to word line split voltage, half the desired read or program voltage, for example. To avoid undesired simultaneous addressing of memory cells coupled to different adjacent bit lines and to a same word line therebetween, biasing of adjacent sense lines is avoided. In one embodiment, first nodes (e.g., sources, or drains, of the TFTs) of selection transistors in the row are biased with every two adjacent TFTs applied respectively with a second voltage (for example, a bit line selection voltage $V_{SEL}$) and a third voltage (for example, a bit line deselection voltage $V_{DESEL}$, in some cases GND or 0V) different with each other. For instance, the sense lines $SL_1$ and $SL_3$ may be applied with second voltage ($V_{SEL}$), while the sense line $SL_2$ may be applied with the third voltage ($V_{DESEL}$).

In one embodiment, a word line plane may be selected, for example, Plane 1. In the selected Plane 1, a first set of (deselected) word lines may include word lines $WL_{11}$ and $WL_{13}$, and a second set of (multiple selected) word lines may include word lines $WL_{12}$ and $WL_{14}$. In one embodiment, the first set of word lines may be applied with a second deselection voltage (e.g., a word line deselection voltage $V_{DESEL2}$, such as GND or 0V), while the second set of word lines may be applied with a fourth voltage (e.g., a word line selection voltage $V_{SEL2}$). The word line selection voltage $V_{SEL2}$ may have a different polarity than a polarity of the (bit line) selection voltage $V_{SEL}$; in some cases, $V_{SEL2}$ may have same amplitude and opposite polarity than $V_{SEL}$, e.g., $V_{SEL2}=-V_{SEL}$). In this case, all the memory cells coupled to the multiple selected word lines $WL_{12}$ and $WL_{14}$ are biased at $V_{SEL2}$, and only active cells (for example, $M_{122}$ and $M_{126}$) that have the other electrode coupled to one of the multiple selected bit lines, e.g., selected pillars $BL_{21}$ and $BL_{23}$, respectively, are fully biased to the (total) read/write voltage $V_{SEL}-V_{SEL2}$ (e.g., $2V_{SEL}$, in case of exact voltage splitting), other unaddressed cells on $WL_{12}$ and $WL_{14}$ coupled to deselected bit lines (e.g., $M_{123}$ coupled to $BL_{22}$) are biased to $-V_{SEL2}$. Memory cells on $WL_{11}$ and $WL_{13}$, are biased to $V_{SEL}$ ($M_{121}$ and $M_{125}$, coupled to selected bit lines $BL_{21}$ and $BL_{23}$) or to 0V ($M_{124}$ coupled to a deselected bit line $B_{22}$), respectively.

Bit lines on different rows may be deselected applying an inhibit voltage $V_{INHIBIT}$ to the corresponding plurality of common gates of respective rows (e.g., pillar lines $PL_1$ and $PL_3$) of third selection transistors different from the row of selection transistors (e.g., with pillar line $PL_2$ as common gate). This biasing decouples the bit line pillars (e.g., $BL_{11}$, $BL_{12}$, $BL_{13}$, and $BL_{31}$, $BL_{32}$, $BL_{33}$) from sense lines ($SL_1$, $SL_2$ and $SL_3$) so that such deselected bit lines are effectively floated to a virtual ground voltage. Word lines on different planes (e.g., Plane 2) may be deselected applying a word line deselection voltage or a floating voltage. Bit line and/or word line deselection voltages ($V_{DESEL}$ and $V_{DESEL2}$) may be intermediate voltages between the bit line selection voltage ($V_{SEL}$) and the word line selection voltage ($V_{SEL2}$). In some cases, the selection voltages may have an opposite polarity and a same or about same amplitude. In some cases, the deselection voltages may have a same or similar amplitude and/or be a ground or virtual ground voltage.

Depending on a polarity of the $V_{SEL}$-$V_{SEL2}$ voltage, a positive voltage read operation, or a negative voltage read operation may be carried out during a read access operation, for example. Depending on a polarity (and possibly an amplitude) of the $V_{SEL}$-$V_{SEL2}$ voltage, the memory cell may be programmed to one of a plurality of logic states during a write access operation; for example, a positive $V_{SEL}$-$V_{SEL2}$ voltage may SET the memory cell while a negative $V_{SEL}$-$V_{SEL2}$ voltage may RESET the memory cell (where a SET state may correspond to a logic value 1 and a RESET logic state may correspond to a logic value 0, but other conventions are possible).

As described above, a plurality of memory cells can therefore be simultaneously addressed and accessed within a same physical memory array, for example, in the same tile. In the example described with reference to FIG. 1, memory cells on multiple (alternate) bit lines and multiple (alternate) word lines are biased to the desired access voltage (that may be a read or a write voltage). Bit lines ($BL_{xy}$) are driven to the desired selection or deselection voltage by appropriate biasing of respective sense line ($SL_y$) and pillar line ($PL_x$), while word lines ($WL_{zy}$) may be independently selected or deselected. Memory cells ($M_{zxy}$) at crossing of bit lines ($BL_{xy}$) and word lines ($WL_{zy}$) thus receive the desired selection, deselection, or null voltage.

It should be noted that a sole memory cell is addressed in each bit line ($BL_{xy}$) and in each word line ($WL_{zy}$), e.g., in each bit line pillar and in each word line finger. Accordingly, even in case of simultaneous selection of multiple memory cell, there is no electric interaction in either access line; for example, ohmic voltage drop associated with turning on of memory cell does not affect biasing of other memory cells. In case even/odd word lines are electrically coupled (for example, $WL_{12}$ and $WL_{14}$ are fingers of a comb-like first word line plate and $WL_{11}$ and $WL_{13}$ are fingers of a comb-like second word line plate interdigited with the first word line plate, the voltage drop on each addressed finger or word line is due to the current driven by the sole addressed memory cell coupled to that given finger or word line. Each word line plate may have a spine portion (not shown in FIG. 1) featuring a larger width than the width of each word line finger; accordingly the voltage drop (in the spine portion) associated to the sum of the currents driven in the different word line fingers may be reduced to an acceptable limit. Similar considerations apply to other planes, when addressed. These concepts are described in more detail below.

FIG. 1A shows a schematic top view of a 3D memory array 100A that supports read/write parallelism. Array 100A, that may be an example of array 100 of FIG. 1, may comprise a plurality of planes 190. For improved clarity in the description that follows, top-most plane depicted in FIG. 1A may represent an addressed plane; other not addressed planes may be present above and/or below the depicted addressed plane. Within each plane 190, array 100A may include a plurality of storage element materials 110, that may correspond to memory cells $M_{zxy}$ in FIG. 1, each comprising a chalcogenide material positioned between one word line finger 170 and 180 (each coupled to a respective word line plate WL odd and WL even) and one bit line pillar 120. A dielectric material 130 may be present therebetween. Word lines 170 and 180 and pillars 120 may be examples of word lines $WL_{zy}$ and bit lines $BL_{xy}$, respectively, in FIG. 1. In some examples, depending on the decoding optimization, the pillars 120 may be coupled to a plurality of selectors 150 positioned at a top, a bottom, or both a top and a bottom (e.g., below and/or above the plurality of word line plates) of the 3D memory array 100.

Sense lines 160 may be conductive lines located, for example, at the bottom of the memory array and provided for supplying the biasing voltage to the pillars 120. Pillar lines 140 may be conductive lines located, for example, at the bottom of the memory array and provided for transferring to the pillars 120 or blocking the biasing voltage supplied through sense lines 160.

FIG. 1B is a schematic cross-sectional view 100B along line B-B of the example memory array 100A of FIG. 1A wherein conductive pillars 120 represent the access lines (e.g., $BL_{xy}$ of FIG. 1) and word lines 170 (e.g., $WL_{zy}$ of FIG. 1) run into and out of the section 100B. Memory cells (e.g., memory cells $M_{zxy}$ of FIG. 1) are at crossing of bit lines 120 and word lines 170 and may comprise self-selecting memory material (e.g., a chalcogenide material). In the depicted embodiment, a plurality of memory cells 110 is coupled to each digit line pillar 120. In particular, two memory cells are coupled to any pillar 120 on each plane 190, the two memory cells being respectively coupled to one of two word lines (170, 180) adjacent to the pillar on opposite sides of the pillar; the two word lines may be respectively coupled to the WL odd and the WL even word line plates (out of the section 100B), as illustrated with reference to FIG. 1A, for example. Each word line 170 or 180 in any given plane 190 is also coupled to a plurality of memory cells 110, only two of which are depicted in section 100B (other pairs are present at each section parallel to line B-B, in correspondence to each row of pillars 120, as illustrated in FIG. 1). Each cell 100 coupled to a given word line 170 or 180 is respectively coupled to a different pillar 120 at opposite sides of the word line. Planes 190 comprise conductive word line plates (WL odd, WL even) with respective word line fingers 170, 180 and are electrically insulated from each other by a dielectric material 130 within a plane. Word lines and word line plates on adjacent planes are electrically insulated from each other by dielectric material 131.

The pillar line 140 (below the array in cross section 100B) is indicative of a signal line (e.g., $PL_x$ in FIG. 1) coupled to a plurality of decoding or selection transistors 150 (that may correspond to selection devices $Q_{xy}$ in FIG. 1), at least one for each pillar 120, having a structure and function that will be disclosed later. Sense lines 160, that may correspond to sense lines $SL_y$ in FIG. 1, may run parallel to each other crossing pillar lines 140, e.g., into and out of cross section 100B.

Any given cell may be individually selected and activated for access by applying appropriate voltages the access lines that specific cell is coupled therebetween. For example, memory cell 110b (110a in FIG. 1A) may be accessed applying a bit line selection voltage selection voltage ($V_{SEL}$) to bit line pillar 120b (120a) and a second selection voltage, e.g., a word line selection voltage, $V_{SEL2}$ to word line 170b (170a). In some examples, $V_{SEL2}$ may have same amplitude and opposite polarity than $V_{SEL}$, e.g., $V_{SEL2}$=-$V_{SEL}$. Bit line selection voltage $V_{SEL}$ may be provided by sense line 160b and transferred by transistor 150b the gate of which is coupled to pillar line 140b (140a), for example biased to a pass gate voltage $V_{PG}$. Word line selection voltage $V_{SEL2}$ may be provided to word line 170b (170a) by polarizing comb-like word line plate WL odd in the addresses plane.

Bit line and word line selection voltages may be provided by respective bit line drivers and word line driver (not shown).

To avoid selection of other memory cells in the memory array 100 (100A and 100B), the other nodes of the (unselected) memory cells are biased so that memory cells are either left floating or at most biased with a voltage insufficient to activate them. For example, considering the memory cell coupled to the selected bit line 120b (120a) but on the opposite side of the addressed memory cell 110b (110a), it may have the word line 180 biased to a word line deselection voltage $V_{DESEL2}$, such as a ground (GND) voltage, or 0V. In this way, a total voltage drop of only $V_{SEL}-V_{DESEL2}$ (or $|V_{SEL}|$, if $V_{DESEL2}=0V$), that may be insufficient to activate the cell, is applied across it. The $V_{DESEL2}$ voltage may be provided to word line 180 by polarizing comb-like word line plate WL even in the addresses plane to GND, for example. Considering now the memory cell coupled to the addressed word line 170b (170a) but on the opposite side of the addressed cell 110b (110a), it may have the bit line 120 biased to a deselection voltage $V_{DESEL}$, such as a ground (GND) voltage, or 0V. The $V_{DESEL}$ voltage may be provided to bit line 120 by polarizing the corresponding sense line 160 to GND, for example, and transferring the deselection voltage through transistor 150 the gate of which is coupled to pillar line 140b (140a), for example biased to a pass gate voltage $V_{PG}$. In this way, a total voltage drop of only $V_{DESEL}-V_{SEL2}$ (e.g., not exceeding $|V_{SEL2}|$ if $V_{DESEL}=0V$), that may be insufficient to activate the cell, is applied across the deselected memory cell. Other memory cells on different planes and/or different cross sections may have unaddressed word line and/or bit line nodes (possibly both word line and bit line nodes) floated or grounded. For example, an unaddressed bit line pillar 120 may be floated by applying an inhibit voltage $V_{INHIBIT}$ to gate node of selection transistor 150 through pillar line 140, thereby insulating the bit line; in some cases, $V_{INHIBIT}$ may be a ground voltage. Alternatively, an unaddressed bit line pillar 120 may be grounded by turning on corresponding select transistor 150 (e.g., biasing its gate to a pass gate voltage $V_{PG}$) and providing the ground voltage through pillar line 160. Word line plates (WL odd, WL even) on different planes may be grounded or floated through respective drivers. In all cases, unaddressed memory cells are not activated.

FIG. 2 shows diagrams of example 3D vertical memory array that supports read/write parallelism in accordance with an embodiment of the present disclosure. A top view 201 of the addressed plane 204 addr in the 3D vertical memory array is depicted at the top of FIG. 2. A cross-sectional view 202 of the 3D vertical memory array along cut line U-U in top view 201 is depicted in the middle of FIG. 2. Another cross-sectional view 203 of the 3D vertical memory array along cut line A-A in top view 201 is depicted in the bottom of FIG. 2. The array depicted in FIG. 2 may be an example of array 100 and array 100A and 100B described above with reference to FIGS. 1, 1A and 1B. Cut line U-U and section 202 may be representative of unaddressed memory cells and cut line A-A and section 203 may be representative of a cut line and a section including addressed memory cells, e.g., simultaneously accessed memory cells.

As previously reported, in embodiments of the present disclosure the 3D vertical memory array may comprise a plurality of word line planes 204 (four planes are depicted for clarity, but there may be more or fewer planes; for example, 2, 8, 16, etc. planes) each including a first set of word lines 205 (e.g., WL odd) and a second set of word lines 206 (e.g., WL even), a plurality of bit lines perpendicular to the word line plane, a plurality of memory cells 207 each accessed through a word line and a bit line coupled thereto, and a plurality of selection transistors 208 (e.g., thin film transistors (TFTs)) each coupled with one bit line 209.

As shown in FIG. 2, a whole row of TFTs 208', for example N-type TFTs, can be turned on by applying a pass gate voltage $V_{PG}$ to the common TFT gate (e.g., through a pillar line 240' (PL)), while selected sense lines 260' (SLs highlighted in red color in cross section 203 of FIG. 2) are biased to a first (bit line) selection voltage $V_{SEL}$, for example half the desired read or program voltage) to select multiple bit lines 209'. Deselected sense lines 260" (SLs highlighted in grey color in cross section 203 of FIG. 2) are biased to a first (bit line) deselection voltage $V_{DESEL}$, in some cases a ground voltage, GND or 0V) to deselect bit lines 209". To avoid undesired simultaneous addressing of memory cells coupled to different adjacent bit lines 209' and 209" and to a same word line therebetween, biasing of adjacent sense lines (and therefore adjacent bit lines) to the selection voltage is avoided.

In one embodiment, a select voltage ($V_{SEL}$) may be applied to first nodes, e.g., a source node (or drain node), of TFTs 208' in the row, each selection transistor 208' coupled to respective selected bit line 209'. A deselect voltage ($V_{DESEL}$) may be applied to first nodes, a source node (or drain node), of second selection transistors 208" in the row, each second selection transistor 208" coupled to respective deselected bit line 209". In one embodiment, source (or drain) nodes of the TFTs 208' 208" in the row may be biased through respective sense lines 260' 260", with every two adjacent TFTs applied respectively with a deselection voltage $V_{DESEL}$ and a selection voltage $V_{SEL}$, for example, GND or 0V and half the desired access voltage (e.g., half the read or program voltage); it is remarked that, for typographical and clarity reasons and as an example only, the value 0 is reported in FIG. 2, however, other values for $V_{DESEL}$ may be used, as explained above. Since all TFTs 208' 208" in the addressed row are in the on state (addressed plate line 240' is biased to $V_{PG}$), the sense line voltage (either $V_{SEL}$ or $V_{DESEL}$) is transferred to the corresponding bit line 209' or 209". Word line biasing is going to be described in subsequent paragraphs.

With reference now to cross section 202, depicting deselected (e.g., unaddressed) memory cells on deselected or unaddressed rows different with respect to the row including the multiple selected memory cells, in some embodiments, the unaddressed rows of TFTs 208 can be turned off by applying, for example, an inhibit voltage $V_{INHIBIT}$ (such as a GND voltage or 0V, or in any case lower than the selection voltage $V_{SEL}$ applied to the selected sense lines 260') to the common TFT gate through respective pillar lines 240 (PLs). Based on the selection transistors 208 in unaddressed rows being off, unaddressed bit lines 209 are biased to a floating voltage. The floating voltage may initially be close to a ground voltage and it may remain close to ground irrespective of multiple selected memory cells (207', 207", 207''', 207'''') being accessed, turning on and/or driving current. Consequently, unaddressed memory cells are never biased to a voltage that can trigger or disturb them.

According to the embodiment of the present disclosure, multiple word lines may be selected and biased to a word line selection voltage $V_{SEL2}$, that may have an opposite polarity with respect to the polarity of the first (bit line) selection voltage $V_{SEL}$. The multiple selected word lines may be coupled to word line plate (WL even the top view 201 of FIG. 2) in the addressed plane. For example, each selected word line 206 may be a word line finger 206 of a comb-like word line plate (WL even), all word line fingers coupled to a spine portion 210 of the word line plate WL even. All the memory cells 207 coupled to the selected word line fingers 206 of word line plate WL even have one end, e.g., the terminal coupled to a respective word line finger 206 biased at the second selection voltage $V_{SEL2}$. The other word line plate (WL odd) may be deselected and biased to a word line deselection voltage, e.g., $V_{DESEL2}$, that may be a ground voltage GND or 0V, in some examples. All the memory cells 207 coupled to the deselected word line plate (WL odd) have one end, e.g., the terminal coupled to a respective word line finger 205) biased at the word line deselection voltage $V_{DESEL2}$. In some embodiments, word line deselection voltage $V_{DESEL2}$ may be the same or substantially the same as the bit line deselection voltage $V_{DESEL}$ (e.g., $V_{DESEL2}=V_{DESEL}$; for example both deselection voltages may be a ground voltage, or 0V). Bit line and/or word line deselection voltages ($V_{DESEL}$ and $V_{DESEL2}$) may be intermediate voltages between the bit line selection voltage $V_{SEL}$ and the word line selection voltage $V_{SEL2}$.

Only the Active Cells (AC), for example, 207', 207", 207''', and 207'''', that also have their bit line pillars 209' selected and biased to $V_{SEL}$ are addressed and fully biased to the desired read/program voltage $V_{SEL}-V_{SEL2}$ (or $2*V_{SEL}$ in case of exact voltage splitting, that is $V_{SEL2}=-V_{SEL}$). Accordingly, multiple memory cells, e.g., active cells AC, may be simultaneously accessed, with each memory cell at a crossing of a selected word line 206 of the selected multiple word lines (WL even) and a selected bit line 209' of the selected multiple bit lines.

Other unaddressed memory cells are either biased with a null or anyway negligible voltage, or anyway with an insufficient voltage to trigger or disturb them. For example, cells in the addressed row but on unaddressed bit lines 209" that face unaddressed word lines 205 may have the same deselection biasing ($V_{DESEL}=V_{DESEL2}$=GND) on both terminals. For example, cells in the addressed row coupled to addressed bit lines 209' that face unaddressed word lines 205 are biased at $V_{SEL}-V_{DESEL2}$, that may be about half the read/program voltage. For example, cells coupled between an addressed word line finger 206 of word line plate (WL even) and unaddressed bit lines 209 on unaddressed rows are substantially biased at $V_{SEL2}$ (the bit line terminal being floating, substantially at a virtual ground). For example, cells coupled between an unaddressed word line finger 205 of word line plate (WL odd) and unaddressed bit lines 209 on unaddressed rows are substantially biased at the same voltage close to $V_{DESEL2}$ (the bit line terminal being floating, substantially at a virtual ground and $V_{DESEL2}$ being GND or close to it).

Unaddressed memory cells on different planes (e.g., unaddressed planes 204) may have bit line terminals biased to the respective bit line voltage ($V_{SEL}$ for cells coupled to addressed bit lines on the addressed row, $V_{DESEL}$ or GND for cells coupled to unaddressed bit lines on the addressed row, and float for cells coupled to unaddressed bit lines on unaddressed rows). All word lines in unselected planes 204 (e.g., both word line plates WL even and WL odd of any unaddressed plane) may be biased to a deselection voltage (e.g., $V_{DESEL2}$, such as a ground voltage GND or 0V) or to a floating voltage, that may be a virtual ground. The biasing may be provided by respective drivers coupled to the word line plates. All unaddressed memory cells in unaddressed planes 204 are therefore biased at most to a $V_{SEL}$ voltage (those cells coupled between an addressed bit line 209' and a grounded or virtually grounded word line) and otherwise to a null or substantially null voltage (the remaining cells).

In the embodiments described with reference to FIG. 2, e.g., a very high parallelism can be reached; for example N/2 cells may be simultaneously accessed, where N is the number of bit lines of the array or sub-array (e.g., the number of bit lines belonging to a certain word line plane slice). The embodiment shown in FIG. 2 is only for a purpose of illustration, and different parallelism levels N/4, N/8, . . . are also possible. For example, fewer than alternate sense lines (SL) may be simultaneously biased to the selection voltage $V_{SEL}$ (e.g., about half of the full read/program voltage), so that fewer bit lines 209' are simultaneously addressed for simultaneously accessing multiple memory cells, with each memory cell at a crossing of a selected word line of the selected multiple word lines and a selected bit line of the selected multiple bit lines. Additionally and/or alternatively, a different word line organization (and corresponding decoding) may be adopted. For example, more than two word line plates may be formed on each plane or deck of the array.

It has been described above how to simultaneously access multiple memory cells at a crossing of a selected word line of selected multiple word lines and a selected bit line of selected multiple bit lines. Additionally and/or alternatively, selecting multiple bit lines may comprise selecting a subset of the bit lines in the memory array; for example, one in every group of n bit lines may be selected (e.g., one every 4 bit lines, or one every 8, or 16, etc. bit lines may be selected), resulting in an access parallelism of N7n, where N is the number of bot lines in the array or sub-array. In some cases, e.g., as described with reference to FIG. 2, one in each two bit lines may be selected; that is selecting multiple bit lines may comprise selecting alternate bit lines in the memory array, resulting in an access parallelism of N/2. Additionally and/or alternatively, selecting multiple bit lines may comprise selecting bit lines in the memory array based on a datum to be programmed, as described in detail below. Any combination of bit line selection is possible, also in combination (e.g., selecting bit lines within a subset of the bit lines in the memory array based on a datum to be programmed).

In some cases, the number of simultaneously addressed memory cells may be based on data content to be programmed in the array. For example, if a codeword is to be programmed, the codeword including both 0s and 1s, it may be desirable to simultaneously access memory cells into which a 0 is to be programmed at one time and to simultaneously access the memory cells into which a 1 is to be programmed at another time different than the first time (e.g., an earlier time or a later time). In other words, selecting multiple bit lines may comprise selecting bit lines in the memory array based on a datum to be programmed; for example bit line selection may be based on datum 0 (or datum 1) to be programmed into a memory cell coupled to the selected bit line. With such an approach it is possible, in fact, to limit the maximum voltage needed for programming. As explained above, the two logic states 0 and 1 may be programmed applying pulses with different polarity to the memory cell; for example a cell may be SET with a positive voltage to store a logic 1 and it may be RESET with a negative voltage to store a logic 0. The amplitude of the positive or negative voltage may be split between the bit line and the word line so that the respective drivers need to be designed for generating half the maximum voltage swing in either polarity.

Pulses of opposite polarity may be applied to multiple selected bit lines and multiple selected word lines to write one datum into memory cells at respective crossings, and reversing both polarities to program the other datum to other memory cells selecting corresponding multiple bit lines and multiple word lines, for example). In the configuration described above with reference to FIG. 2, for example, word lines are grouped in word line plates and, therefore, word line fingers coupled to a word line plate cannot be simultaneously biased at different voltages; in particular the addressed word lines may either be positively biased or negatively biased, for example. Accordingly, the polarity inversion for SETting and RESETting memory cells is obtained serializing the two pulses (e.g., the positive SET pulse and the negative REST pulse), grouping memory cells for simultaneous access based on the data content to be programmed therein and proceeding for each pulse as described. During each of the two serial programming pulses (e.g., for writing 1s and 0s), memory cells that are not selected may be biased to the deselection voltage. In some embodiments a bit line deselection voltage may be applied as described above, since the word lines (including word lines fingers coupled to deselected memory cells) may be biased to the word line selection together with other word line fingers coupled to the selected word line plate (e.g., all word line fingers of the same comb-like plate are biased to the same positive or negative voltage during the write pulses).

According to the embodiments of the present disclosure, multiple memory cells are simultaneously accessed. Each bit line in the memory array may be coupled to a plurality of memory cells (for example, each bit line pillar may be coupled to memory cells on different planes or decks of the array including a pair of memory cells in each plane or deck, as described above) but a sole memory cell coupled to a given bit line is selected at any time. Correspondingly, a resistance of a bit line 209' of a memory cell (e.g., an active cell 207"") that is accessed may be not shared with other accessed memory cells 207', 207", and 207''', so that any possible voltage drop due to memory cell's snapping is not going to affect other addressed cells.

Similarly, each word line in the memory array may be coupled to a plurality of memory cells (for example, each word line finger may be coupled to memory cells on different rows including a pair of memory cells coupled to different bit lines in the addressed row, as described above) but a sole memory cell coupled to a given word line finger 206 is selected at any time. Correspondingly, a resistance of a word line finger 206 of a memory cell (e.g., an active cell 207"") that is accessed may be not shared with other accessed memory cells 207', 207", and 207''', so that any possible voltage drop due to memory cell's snapping is not going to affect other addressed cells (the other addressed cells being coupled to different word line fingers, for example).

In one embodiment, in order to avoid current crowding in the current path to the word line driver, a spine 210 of the first or second set of word lines (e.g., word line plate WL odd or word line plate WL even) in each word line plane 204, from which the first or second set of word lines 205 or 206 depart, has a width $W_S$ larger than a width $W_F$ of word lines 205 or 206 of respective comb-like word line plate. For example, the width $W_S$ of the spine 210 may be uniformly increased so that the width $W_S$ of the spine 210 may be larger than a width $W_F$ of each word line finger of the first or second set of word lines 205 or 206. For example, the spine 210 may have a width $W_S$ that is from twice to many times the width $W_F$ of a word line finger 205, 206. In some cases, the spine width $W_S$ may be 16 times the width of a word line finger $W_F$; in other cases, it may exceed the width of a word line by a factor 4, 10, 50, 64, or even more.

In one embodiment, a plurality of bit line drivers (not shown) may be provided each coupled with one sense line 260 (e.g., $SL_y$ in FIG. 1) and selectively coupled to individual bit lines 209 (e.g., $BL_{xy}$ of FIG. 1) through corresponding bit line select device (e.g., TFTs 208 or 208', or $Q_{xy}$ in FIG. 1) decoded by pillar lines (e.g., $PL_x$ in FIG. 1), each bit line driver configured to provide power to one memory cell in the selected bit line of the simultaneously accessed multiple memory cells. Each bit line driver may have a current capability sufficient to sustain an expected current driven by the addressed memory cell (and all parasitic currents, such as the current needed to charge the capacitive loads to the desired voltage in the desired time or leakage currents).

Said it differently, a plurality of bit line drivers is provided, each bit line driver configured to be selectively coupled with one bit line (for example, a bit line driver may be coupled to a selected bit line pillar and/or another bit line driver may be coupled to a deselected bit line pillar, during an access operation) wherein each bit line driver is configured to drive a single memory cell.

In embodiments of the present disclosure, the word lines 206 in selected word line plate WL even (or word lines 205 in case plate WL odd is selected) only carry a single cell current, solving the issue on a 2D solution. A spine region 210 of the selected word line plate (e.g., WL even the spine portion of which is circled in red in FIG. 2 according to the example depicted therein, or spine portion of plate WL odd, if/when selected) needs to sustain the sum of currents of simultaneously accessed memory cells, e.g., N/2 currents. As described above, the spine portion 210 has a width $W_S$ greater than a width $W_F$ of each of the word lines of the multiple selected word lines. The width of the spine portion may be designed to reduce to an acceptable limit the possible voltage drop (in the spine portion) associated to the sum of the currents driven in the different word line fingers, without significant die size impact (also allowing more efficient contacting, too).

A plurality of word line drivers (not shown), that may be indifferently referred to as word line plate drivers, may be also provided, each word line driver selectively coupled with one or more word lines (e.g., word line $WL_{zy}$) in a word line plane; in some embodiments, one word line driver or word line plate driver is coupled to a word line plate, such as WL odd and/or WL even in FIGS. 1A, 1B and 2, the word line plate coupled to a respective plurality of word lines 205, 206. The word line drivers may be configured to sustain a current corresponding to a sum of currents driven by multiple memory cells simultaneously accessed (e.g., memory cells coupled to different word line fingers of the word line plate) at the selected word line plane. For example, each word line plate driver may be configured to sustain a current driven by N/2 cells, where N is the number of bit lines of the array or sub-array, and N/2 is the number of memory cells that may be simultaneously accessed; other parallelism access capabilities may be sustained.

Said it differently, a word line plate driver may be coupled in parallel to the multiple word lines. The word line plate driver may be configured to drive the simultaneously accessed multiple memory cells. For example, the word line plate driver may have a current driving capability higher than a current driving capability of each and any of the bit line drivers; the word line driver may be configured to deliver a current to sustain a total current of the N/2 simultaneously accessed multiple memory cells, where N is a number of bit lines in the memory array or sub-array, while the bit line drivers are each configured to deliver a current to sustain a current of one memory cell of the simultaneously accessed multiple memory cells.

In some embodiments, the word line drivers may be selectively coupled to a spine region 210 of a word line plate (WL odd, WL even) at a word line plane 204, wherein the spine region has a width $W_S$ that is larger than a width $W_F$ of individual word line fingers 205, 206 coupled to the word line plate. For example, the spine portion may have a width that is from twice to many times the width of a word line. In some cases, the spine width may be 16 times the width of a word line finger; in other cases, it may exceed the width of a word line by a factor 4, 10. 50, 64, or even more.

It's worth recalling that word line drivers are may be designed to charge the word lines in about 10 ns, thus they can provide the high enough current level (about 1 mA) needed to sustain the parallel programming. In one embodiment, programming of 0 states or 1 states may require applying programming pulses of opposite polarity. In some cases, it may be desirable to adopt a word line polarity change approach and programming can be completed in 2 separate steps. In one embodiment, a split voltage approach may be adopted with a (bit line) selection voltage of half of the total access voltage applied on bit lines and a (word line) selection voltage of half of the total access voltage (e.g., with same amplitude but opposite polarity than the bit line select voltage) applied on word lines during a program pulse to write one datum. During the program pulse to write opposite datum, the voltage on word lines must swing from one polarity to the opposite polarity. In one embodiment, a full polarity approach may be adopted with word lines grounded and applying the full positive/negative access voltage on bit lines during a program operation, so that it is possible to simultaneously program 0s and 1s.

According to the embodiment of the present disclosure, it can provide the simultaneous biasing of a number p of pillars belonging to the same line with the simultaneous biasing of the p cells intercepted by the same word line plane. This can allow the parallelism of full codewords reading in the same operation, thus increasing throughput by a factor p. In case of programming (e.g., write), the full codeword programming can be done in 2 steps: the first one for programming the cells in the SET state, the second one for programming the cells in the RESET state (on average half of a codeword).

According to embodiments of the present disclosure, the high throughput of multiple-cells/tile can be exploited for increasing the performances of the memory systems. For example, in mobile applications, storage area may be implemented using multi-level NAND memory devices (e.g., QLC NAND) a 3D vertical memory array device described herein may be used as cache. Additionally, in computing applications, NAND devices may be completely replaced with 3D vertical cross point devices, e.g. self-selecting 3D memory devices, for high performance storage systems.

Figure 3:
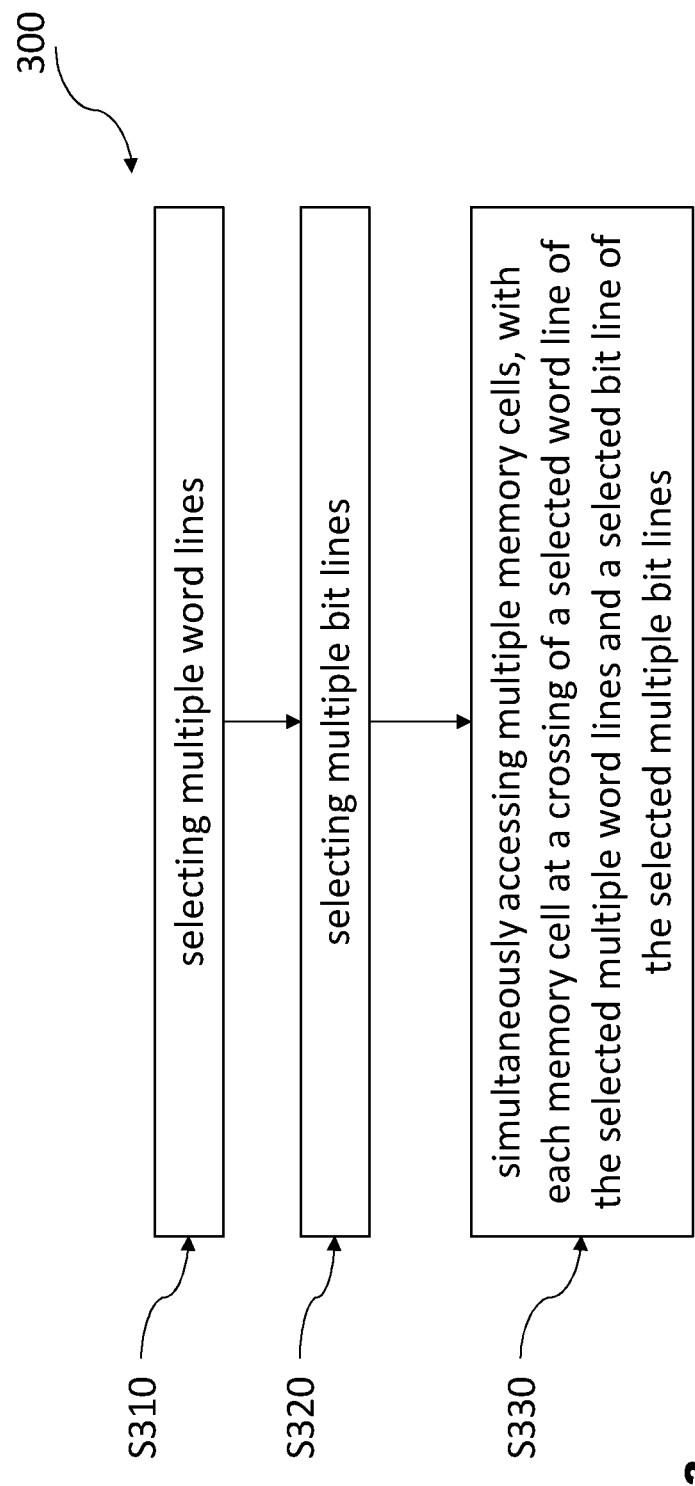
FIG. 3 is flow chart illustrating a method for the read/write parallelism in accordance with an embodiment of the present disclosure.

FIG. 3 is flow chart illustrating a method 300 for the read/write parallelism in accordance with an embodiment of the present disclosure. The operations of method 300 may be implemented by one or more controllers. In some examples, one or more controllers may execute a set of instructions to control one or more functional elements to perform the described functions. Additionally or alternatively, one or more controllers may perform aspects of the described functions using special-purpose hardware. The method 300 may be implemented in conjunction with, e.g., applied to, memory devices including memory arrays as described with reference to FIGS. 1, 1A, 1B and 2. However, method 300 may also be applied to other memory array types and/or architectures.

At 5310, the method 300 may comprise selecting multiple word lines. The operations of 5310 may be performed according to the method described herein.

At 5320, the method 300 may comprise selecting multiple bit lines. The operations of 5320 may be performed according to the method described herein.

At 5330, the method 300 may comprise simultaneously accessing multiple memory cells, with each memory cell at a crossing of a selected word line of the selected multiple word lines and a selected bit line of the selected multiple bit lines. The operations of 5330 may be performed according to the method described herein.

In some examples, simultaneously selecting multiple bit lines may comprise applying a pass gate voltage ($V_{PG}$), e.g., a first voltage, to a common gate of a row of selection transistors. Simultaneously selecting multiple bit lines may further comprise applying a select voltage ($V_{SEL}$), e.g., a second voltage, to first nodes of selection transistors in the row, each selection transistor coupled to respective selected bit line. Simultaneously selecting multiple bit lines may further comprise applying a (bit line) deselect voltage ($V_{DESEL}$), e.g., a third voltage, to first nodes of second selection transistors in the row, each second selection transistor coupled to respective deselected bit line. The select voltage and the deselection voltage may be different from each other. As described with reference to FIG. 2, for example, the common gate of each row of selection transistors may be coupled to a respective pillar line. First nodes (e.g., source, or drain, nodes) of selection transistors may be coupled to sense lines crossing the pillar lines. Selection transistors may be coupled to bit line pillars in the memory array.

In some examples, selecting multiple word lines may comprise applying to the selected word lines a word line select voltage ($V_{SEL2}$), e.g., a fourth voltage that in some cases may have a same amplitude and different polarity than the second voltage. In some embodiments, the selected word lines may be word line fingers of a word line plate (for example a com-like plate on a word line plane) and selecting the multiple word lines may comprise applying the word line select voltage to the word line plate. In some embodiments, selecting the multiple word lines may comprise applying to deselected word lines a word line deselect voltage ($V_{DESEL2}$), e.g., a fifth voltage that in some cases may be the same as the third voltage. The deselected word lines may be word line fingers of a second word line plate (for example another com-like plate interdigited to the comb-like plate, on the word line plane) and deselecting the multiple word lines may comprise applying the word line deselect voltage to the second word line plate. The fourth voltage and the fifth voltage are different from each other.

In some examples, the method further comprises applying an inhibit voltage to a plurality of common gates of respective rows of third selection transistors different from the row of selection transistors to float (e.g., deselect) unaddressed bit lines. The method may further comprise applying a word line deselection voltage or a floating voltage to a plurality of word lines (for example a plurality of word lines on unaddressed word line planes) to deselect the plurality of word lines.

In some examples, the first voltage may be a pass gate voltage $V_{PG}$, the second voltage may be the bit line selection voltage $V_{SEL}$ (in some cases about half the total access voltage to be applied to addressed memory cells), the third voltage may be the bit line deselection voltage $V_{DESEL}$ (e.g., a ground voltage GND, or 0V, in some cases), and the fourth voltage and the fifth voltage may respectively be the word line selection voltage $V_{SEL2}$ (that may have an opposite polarity than the first selection voltage $V_{SEL}$ and, in some cases, it may have the same or about the same amplitude) and the word line deselection voltage $V_{DESEL2}$ (that in some cases may be the same as the bit line deselection voltage), as described above with reference to FIGS. 1, 1A, 1B and 2, for example.

In some examples, a selection transistor of the plurality of selection transistors may be a thin film transistor (TFT). In some examples, a source or drain (e.g., a first node) of each selection transistor of the row of selection transistors may be biased while the other drain or source of the selection transistor is coupled with one bit line.

In some examples, a spine portion of the word line plates from which respective selected and unselected word lines depart, may have a width larger than that of the first or second set of word lines. The method may comprise collecting a current of each memory cell of the simultaneously accessed multiple memory cells through a respective bit line and/or collecting a total current of the simultaneously accessed multiple memory cells through a spine portion of a word line plate coupled to the multiple word lines, the spine portion having a width greater than a width of each word line of the multiple word lines.

In some examples, a plurality of bit line drivers each coupled with one bit line may be arranged to provide power to the plurality of memory cells each coupled to respective bit line, and a single word line driver coupled with the selected word line plate may be arranged to sustain a current of all memory cells simultaneously accessed, e.g., active memory cells at crossing of the selected bit lines and the selected word lines coupled with the selected word line plate at the selected word line plane. The method may comprise driving each bit line in the selected multiple bit lines with a respective bit line driver selectively coupled to each bit line, driving the selected multiple word lines with a word line plate driver coupled in parallel to the multiple word lines, wherein the bit line drivers may be configured to drive a single memory cell and the word line plate driver is configured to drive the simultaneously accessed multiple memory cells.

FIG. 4 is a block diagram of a memory apparatus 400 in accordance with examples as disclosed herein. As used herein, an "apparatus" can refer to, but is not limited to, any of a variety of structures or combinations of structures, such as a circuit or circuitry, a die or dies, a module or modules, a device or devices, or a system or systems, for example. As shown in FIG. 4, the memory apparatus 400 can include a 3D memory array 410. The 3D memory array 410 can be analogous the 3D memory arrays previously described in connection with FIGS. 1, 1A, 1B and 2 (e.g., array 100, views 100A and 100B, and views 201, 202 and 203). Although FIG. 4 shows a single 3D memory array 410 for clarity and so as not to obscure embodiments of the present disclosure, the memory apparatus 400 may include any number of the 3D memory array 410.

As shown in FIG. 4, the memory apparatus 400 can include a controller 420 coupled to the 3D memory array 410. The controller 420 can be included on the same physical device (e.g., the same die) as the 3D memory array 410. The 3D vertical memory array 410 may comprise word lines organized in planes separated from each other by insulating material, bit lines perpendicular to the word line planes and memory cells coupled between a respective word line and a respective bit line. The controller 420 can be included on a separate physical device that is communicatively coupled to the physical device that includes the 3D memory array 410.

The controller 420 can control the accessing to memory cells as mentioned above with reference to FIGS. 1, 1A, 1B and 2 of the 3D memory array 410 during program and/or sense operations performed on the 3D memory array 410. For example, the controller 420 can select multiple word lines (e.g., selecting a word line plate from a plurality of word line plates), select multiple bit lines, and simultaneously access multiple memory cells with each memory cell at a crossing of a selected word line and a selected bit line. Multiple memory cells may be simultaneously accessed either in read and/or write procedures.

In one embodiment, the controller selecting multiple bit lines may comprise applying a pass gate voltage (e.g., a first voltage, $V_{PG}$) to a common gate of a row of selection transistors. The controller may further apply a select voltage (e.g., a second voltage, $V_{SEL}$) to first nodes of selection transistors of the row, each selection transistor coupled to respective selected bit line.

In one embodiment, the controller selecting multiple word lines may comprise applying a word line selection voltage (e.g., a fourth voltage, $V_{SEL2}$) to the selected multiple word lines and applying a word line deselection voltage (e.g., a fifth voltage, $V_{DESEL2}$) to deselected word lines. Selected and deselected word lines may be respectively coupled to a first and a second word line plate on one word line plane, each plate with respective interdigited word line fingers, and applying the word line selection/deselection voltages may comprise applying the selection/deselection voltages respectively to the selected and the deselected word line plate in the word line plane.

The controller is also configured to apply an inhibit voltage ($V_{INHIBIT}$) to a plurality of common gates of respective rows of third selection transistors different from the row of selection transistors to float unaddressed bit lines and memory cells coupled thereto. The controller is further configured to applying a word line deselection voltage or a floating voltage to a plurality of word lines to deselect the plurality of word lines, for example word lines on unaddressed planes and memory cells coupled thereto.

In one embodiment, the first voltage may be a pass gate voltage $V_{PG}$, the second voltage may be a (bit line) selection voltage $V_{SEL}$ of a first polarity the third voltage may be a (bit line) deselection voltage, such as 0V, or a ground voltage GND, the fourth voltage may be a (word line) selection voltage $V_{SEL2}$, with a second polarity opposite with respect to the polarity of $V_{SEL}$, and the fifth voltage may be a (word line) deselection voltage $V_{DESEL2}$, that in some cases is the same as $V_{DESEL}$ (e.g., a GND voltage), as described with reference to FIGS. 1, 1A, 1B and 2, for example.

The embodiment illustrated in FIG. 4 can include additional circuitry, logic, and/or components not illustrated so as not to obscure embodiments of the present disclosure. For example, the memory apparatus 400 can include a decoder circuitry to receive or transmit commands to perform operation on the 3D memory array 410, such as operations to sense (e.g., read), program (e.g., write), move, and/or erase data, among other operations. Further, the memory apparatus 400 can include address circuitry to latch address signals provided over input/output (I/O) connectors through I/O circuitry. Further, the memory apparatus 400 can include a main memory, such as, for instance, a DRAM or SDRAM, that is separate from and/or in addition to the memory array 410.

As shown in FIG. 4, the memory apparatus 400 can include a controller 420 provided with decoding circuitry 430 coupled to the 3D memory array 410. The decoding circuitry 430 can be included on the same physical device (e.g., the same die) as the 3D memory array 410. The decoding circuitry 430 can be included on a separate physical device that is communicatively coupled to the physical device that includes the 3D memory array 410.

The decoding circuitry 430 can receive and decode address signals to access the memory cells, as mentioned above with reference to FIG. 1 of the 3D memory array 100, during program and/or sense operations performed on the 3D memory array 410. For example, the decoding circuitry 430 can include portions of decoder circuitry for use in selecting a particular memory cell of the 3D memory array 410 to access during a program or sense operation. For instance, a first portion of the decoder circuitry can be used to select a word line, e.g., a word line plate in a word line plane, and a second portion of the decoder circuitry can be used to select a digit line, e.g., a bit line.

In apparatus 400 of FIG. 4, each bit line may be configured to collect a current of one memory cell of the simultaneously accessed multiple memory cells, the one memory cell coupled to each bit line. The apparatus 400 may comprise, at each word line plane, a spine portion of a word line plate coupled to the multiple word lines on a word line plane, wherein the spine portion has a width greater than a width of each of the word lines of the multiple word lines. The spine portion may be configured to collect a total current of the simultaneously accessed multiple memory cells coupled to the multiple word lines.

Apparatus 400 may further comprise a plurality of bit line drivers each configured to be selectively coupled with one bit line and a word line plate driver coupled in parallel to the multiple word lines wherein each bit line driver is configured to drive a single memory cell and the word line plate driver is configured to drive the simultaneously accessed multiple memory cells.

The embodiment illustrated in FIG. 4 can include additional circuitry, logic, and/or components not illustrated so as not to obscure embodiments of the present disclosure. For example, the memory apparatus 400 can include a controller to send commands to perform operation on the 3D memory array 410, such as operations to sense (e.g., read), program (e.g., write), move, and/or erase data, among other operations. Further, the memory apparatus 400 can include address circuitry to latch address signals provided over input/output (I/O) connectors through I/O circuitry. Further, the memory apparatus 400 can include a main memory, such as, for instance, a DRAM or SDRAM, that is separate from and/or in addition to the memory array 410.

An apparatus is described. In some examples, the apparatus may include means for selecting multiple word lines, means for selecting multiple bit lines, and means for simultaneously accessing multiple memory cells, with each memory cell at a crossing of a selected word line of the selected multiple word lines and a selected bit line of the selected multiple bit lines.

In some examples, the means for selecting multiple bit lines may include means for applying a pass gate voltage (VPG) to a common gate of a row of selection transistors and means for applying a select voltage (VSEL) to first nodes of selection transistors in the row, each selection transistor coupled to respective selected bit line.

In some examples, the means for selecting multiple bit lines may include applying a deselect voltage (VDESEL) to first nodes of second selection transistors in the row, each second selection transistor coupled to respective deselected bit line.

In some examples, the apparatus may include means for applying an inhibit voltage (VINHIBIT) to a plurality of common gates of respective rows of third selection transistors different from the row of selection transistors.

In some examples, the means for selecting multiple word lines may include means for applying a word line select voltage (VSEL2) to each of the selected multiple word lines.

In some examples, the means for selecting multiple word lines may include means for applying a word line deselect voltage (VDESEL2) to deselected word lines.

In some examples, the apparatus may include means for applying a word line deselection voltage or a floating voltage to a plurality of word lines to deselect the plurality of word lines.

In some examples, the apparatus may include means for applying a bit line select voltage (VSEL) to each of the selected multiple bit lines to select the multiple bit lines and means for applying a word line select voltage (VSEL2) to each of the selected multiple word lines to select the multiple word lines, wherein the word line select voltage (VSEL2) has a different polarity than a polarity of the bit line select voltage (VSEL) and the word line select voltage (VSEL2) has a same amplitude as an amplitude of the bit line select voltage (VSEL).

In some examples, the apparatus may include means for applying a bit line deselect voltage (VDESEL) to each of the deselected bit lines to deselect the deselected bit lines and means for applying a word line deselect voltage (VDESEL2) to each of the deselected word lines to deselect the deselected word lines, wherein bit line deselect voltage (VDESEL) and the word line deselect voltage (VDESEL2) are a same voltage.

In some examples, the means for selecting multiple bit lines may include selecting alternate bit lines in the 3D vertical memory array, means for selecting a subset of the bit lines in the 3D vertical memory array, or means for selecting bit lines in the memory array based on a datum to be programmed.

In some examples, the apparatus may include means for collecting a current of each memory cell of the simultaneously accessed multiple memory cells through a respective bit line.

In some examples, the apparatus may include means for collecting a total current of the simultaneously accessed multiple memory cells through a spine portion of a word line plate coupled to the multiple word lines, the spine portion having a width greater than a width of each word line of the multiple word lines.

In some examples, the apparatus may include means for driving each bit line of the selected multiple bit lines with a respective bit line driver selectively coupled to each bit line and means for driving each of the selected multiple word lines with a word line plate driver coupled in parallel to the multiple word lines.

The method and apparatus of the present disclosure overcome the limitations of the 2D architectures, where the selection of multiple cells in the same sub-array causes an increased IR drop as a consequence of those multiple cells drawing current from the same physical interconnect. Staggering the activation of the cells has been proposed in the past but this comes at the expense of a severely impacted latency.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above may be implemented using software executed by a processor, hardware, firmware, hardwiring, or combinations of any of these. Features implementing functions may also be physically located at various positions, including being distributed such that portions of functions are implemented at different physical locations. As used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A method for accessing a 3D vertical memory array comprising:
    selecting multiple word lines;
    selecting multiple bit lines; simultaneously accessing multiple memory cells, with each memory cell at a crossing of a selected word line of the selected multiple word lines and a selected bit line of the selected multiple bit lines; and
    collecting a total current of the simultaneously accessed multiple memory cells through a portion of a word line plate coupled to the multiple word lines, the portion of the word line plate having a width greater than a width of each word line of the multiple word lines.

2. The method of claim 1, wherein selecting the multiple bit lines comprises:
    applying a pass gate voltage ($V_{PG}$) to a common gate of a row of selection transistors; and
    applying a select voltage ($V_{SEL}$) to first nodes of first selection transistors in the row, each selection transistor coupled to a respective selected bit line.

3. The method of claim 2, wherein selecting the multiple bit lines further comprises:
    applying a deselect voltage ($V_{DESEL}$) to first nodes of second selection transistors in the row, each second selection transistor coupled to a respective deselected bit line.

4. The method of claim 2 further comprising:
    applying an inhibit voltage ($V_{INHIBIT}$) to a plurality of common gates of respective rows of third selection transistors different from the row of selection transistors.

5. The method of claim 2, wherein the selection transistors comprise a thin film transistor (TFT).

6. The method of claim 1, wherein selecting the multiple word lines comprises:
    applying a word line select voltage ($V_{SEL2}$) to each of the selected multiple word lines.

7. The method of claim 6, wherein selecting the multiple word lines further comprises:
    applying a word line deselect voltage ($V_{DESEL2}$) to deselected word lines.

8. The method of claim 6 further comprising:
    applying a word line deselection voltage or a floating voltage to a plurality of word lines to deselect the plurality of word lines.

9. The method of claim 1, further comprising:
    applying a bit line select voltage ($V_{SEL}$) to each of the selected multiple bit lines to select the multiple bit lines; and
    applying a word line select voltage ($V_{SEL2}$) to each of the selected multiple word lines to select the multiple word lines;
    wherein the word line select voltage ($V_{SEL2}$) has a different polarity than a polarity of the bit line select voltage ($V_{SEL}$) and the word line select voltage ($V_{SEL2}$) has a same amplitude as an amplitude of the bit line select voltage ($V_{SEL}$).

10. The method of claim 9, further comprising:
    applying a bit line deselect voltage ($V_{DESEL}$) to each deselected bit line to deselect deselected bit lines; and
    applying a word line deselect voltage ($V_{DESEL2}$) to each deselected word line to deselect deselected word lines;
    wherein the bit line deselect voltage ($V_{DESEL}$) and the word line deselect voltage ($V_{DESEL2}$) are a same voltage.

11. A method for accessing a 3D vertical memory array comprising:
    selecting multiple word lines;
    selecting multiple bit lines, wherein selecting the multiple bit lines comprises:
        selecting alternate bit lines in the 3D vertical memory array,
        selecting a subset of a set of bit lines in the 3D vertical memory array, or
        selecting the multiple bit lines in the 3D vertical memory array based on a datum; and
    simultaneously accessing multiple memory cells, with each memory cell at a crossing of a selected word line of the selected multiple word lines and a selected bit line of the selected multiple bit lines to be programmed.

12. The method of claim 1, further comprising:
    collecting a current of each memory cell of the simultaneously accessed multiple memory cells through a respective bit line.

13. The method of claim 1, further comprising:
driving each bit line of the selected multiple bit lines with a respective bit line driver selectively coupled to each bit line, and
driving each of the selected multiple word lines with a word line plate driver coupled in parallel to the multiple word lines.

14. The method of claim 13 wherein the respective bit line driver is configured to drive a single memory cell and the word line plate driver is configured to drive the simultaneously accessed multiple memory cells.

15. A memory apparatus, comprising:
a 3D vertical memory array comprising word lines organized in word line planes separated from each other by insulating material;
bit lines perpendicular to the word line planes;
a portion of a word line plate coupled to multiple word lines on a word line plane, wherein the portion of the word line plate has a width greater than a width of each of the word lines of the multiple word lines;
memory cells coupled between a respective word line and a respective bit line; and
one or more controllers configured to:
select the multiple word lines;
select multiple bit lines; and
simultaneously access multiple memory cells, with each memory cell at a crossing of a selected word line and a selected bit line.

16. The memory apparatus of claim 15, wherein the one or more controllers are further configured to:
apply a pass gate voltage ($V_{PG}$) to a common gate of a row of selection transistors; and
apply a select voltage ($V_{SEL}$) to first nodes of first selection transistors of the row, each selection transistor coupled to a respective selected bit line.

17. The memory apparatus of claim 16, wherein the one or more controllers are further configured to:
apply a deselect voltage ($V_{DESEL}$) to first nodes of second selection transistors in the row, each second selection transistor coupled to a respective deselected bit line.

18. The memory apparatus of claim 16 wherein the one or more controllers are further configured to:
apply an inhibit voltage ($V_{INHIBIT}$) to a plurality of common gates of respective rows of third selection transistors different from the row of selection transistors.

19. The memory apparatus of claim 16, wherein the selection transistors comprise a thin film transistor (TFT).

20. The memory apparatus of claim 15, wherein the one or more controllers are further configured to:
apply a word line selection voltage ($V_{SEL2}$) to the selected multiple word lines.

21. The memory apparatus of claim 20, wherein the one or more controllers are further configured to:
apply a word line deselection voltage ($V_{DESEL}$) to deselected word lines.

22. The memory apparatus of claim 20 wherein the one or more controllers are further configured to:
applying a word line deselection voltage or a floating voltage to a plurality of word lines to deselect the plurality of word lines.

23. The memory apparatus of claim 15, wherein the one or more controllers are further configured to:
apply a bit line select voltage ($V_{SEL}$) to each of the selected multiple bit lines to select the multiple bit lines; and
apply a word line select voltage ($V_{SEL2}$) to each of the selected multiple word lines to select the multiple word lines;
wherein the word line select voltage ($V_{SEL2}$) has a different polarity than a polarity of the bit line select voltage ($V_{SEL}$) and the word line select voltage (VSEL2) has a same amplitude as an amplitude of the bit line select voltage ($V_{SEL}$).

24. The memory apparatus of claim 23, wherein the one or more controllers are further configured to:
apply a bit line deselect voltage ($V_{DESEL}$) to deselected bit lines to deselect the deselected bit lines; and
apply a word line deselect voltage ($V_{DESEL2}$) to deselected word lines to deselect the deselected word lines;
wherein the bit line deselect voltage ($V_{DESEL}$) and the word line deselect voltage ($V_{DESEL2}$) are a same voltage.

25. A memory apparatus, comprising:
a 3D vertical memory array comprising word lines organized in word line planes separated from each other by insulating material;
bit lines perpendicular to the word line planes;
memory cells coupled between a respective word line and a respective bit line; and
one or more controllers configured to:
select multiple word lines;
select multiple bit lines, wherein, to select the multiple bit lines, the one or more controllers are configured to:
select alternate bit lines in the 3D vertical memory array,
select a subset of the bit lines in the 3D vertical memory array, or
select the multiple bit lines in the 3D vertical memory array based on a datum to be programmed; and
simultaneously access multiple memory cells, with each memory cell at a crossing of a selected word line and a selected bit line.

26. The memory apparatus of claim 15, wherein each bit line is configured to collect a current of one memory cell of the simultaneously accessed multiple memory cells, the one memory cell coupled to each bit line.

27. The memory apparatus of claim 15, wherein the portion of the word line plate is configured to collect a total current of the simultaneously accessed multiple memory cells coupled to the multiple word lines.

28. The memory apparatus of claim 15, further comprising:
a plurality of bit line drivers each configured to be selectively coupled with one bit line; and
a word line plate driver coupled in parallel to the multiple word lines.

29. The memory apparatus of claim 28, wherein each bit line driver is configured to drive a single memory cell and the word line plate driver is configured to drive the simultaneously accessed multiple memory cells.

* * * * *